United States Patent
Yao et al.

(10) Patent No.: US 11,447,697 B2
(45) Date of Patent: Sep. 20, 2022

(54) SUBSTRATE PROCESSING GAS, STORAGE CONTAINER, AND SUBSTRATE PROCESSING METHOD

(71) Applicant: CENTRAL GLASS COMPANY, LIMITED, Yamaguchi (JP)

(72) Inventors: Akifumi Yao, Ube (JP); Yuuta Takeda, Ube (JP); Jun Eto, Ube (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 0 days.

(21) Appl. No.: 17/040,803

(22) PCT Filed: Mar. 5, 2019

(86) PCT No.: PCT/JP2019/008548
§ 371 (c)(1),
(2) Date: Sep. 23, 2020

(87) PCT Pub. No.: WO2019/188030
PCT Pub. Date: Oct. 3, 2019

(65) Prior Publication Data
US 2021/0054275 A1  Feb. 25, 2021

(30) Foreign Application Priority Data
Mar. 29, 2018 (JP) .............................. JP2018-065433

(51) Int. Cl.
C09K 13/00 (2006.01)
C01B 7/24 (2006.01)
H01L 21/3065 (2006.01)
H01L 21/3213 (2006.01)

(52) U.S. Cl.
CPC ................ C09K 13/00 (2013.01); C01B 7/24 (2013.01); H01L 21/3065 (2013.01); H01L 21/32135 (2013.01)

(58) Field of Classification Search
CPC ...... C09K 13/00; H01L 21/32135; C01B 7/24
See application file for complete search history.

(56) References Cited

U.S. PATENT DOCUMENTS

| | | | |
|---|---|---|---|
| 6,207,570 B1 * | 3/2001 | Mucha | H01L 21/02063 257/E21.31 |
| 9,524,877 B2 | 12/2016 | Kikuchi et al. | |
| 9,728,422 B2 | 8/2017 | Oomori et al. | |
| 2010/0196251 A1 * | 8/2010 | Shibayama | C01B 7/24 423/466 |
| 2014/0206196 A1 * | 7/2014 | Umezaki | H01L 21/306 438/706 |
| 2016/0005612 A1 | 1/2016 | Kikuchi et al. | |
| 2016/0218015 A1 | 7/2016 | Oomori et al. | |
| 2016/0379848 A1 * | 12/2016 | Yanagisawa | H01L 21/67109 156/345.26 |
| 2019/0046917 A1 * | 2/2019 | Yao | B01D 53/0423 |
| 2019/0355590 A1 * | 11/2019 | Suzuki | H01L 43/12 |

FOREIGN PATENT DOCUMENTS

| | | |
|---|---|---|
| JP | 2006-265057 | 10/2006 |
| JP | 2014-150169 | 8/2014 |
| JP | 2016-139782 | 8/2016 |
| WO | 2016/157317 | 10/2016 |
| WO | 2017/026001 | 2/2017 |

OTHER PUBLICATIONS

International Search Report dated Jun. 11, 2019 in International (PCT) Application No. PCT/JP2019/008548.

* cited by examiner

*Primary Examiner* — Binh X Tran
(74) *Attorney, Agent, or Firm* — Wenderoth, Lind & Ponack, L.L.P.

(57) ABSTRACT

A substrate processing gas of the present invention contains $IF_5$; and $IF_7$, in which a content of the $IF_5$ is equal to or more than 1 ppm and equal to or less than 2% on a volume basis with respect to a total amount of the $IF_5$ and the $IF_7$.

17 Claims, No Drawings

US 11,447,697 B2

SUBSTRATE PROCESSING GAS, STORAGE CONTAINER, AND SUBSTRATE PROCESSING METHOD

TECHNICAL FIELD

The present invention relates to a substrate processing gas, a storage container, and a substrate processing method.

BACKGROUND ART

Various studies on a technique for producing $IF_7$ gas (iodine heptafluoride) have been conducted. As this type of technique, for example, a technique described in Patent Document 1 is known. In Patent Document 1, while supplying a fluorine gas with circulation, iodine pentafluoride which is another raw material is gasified, and both gases are mixed and react in a gas state (claim 1, paragraph 0001, and the like in Patent Document 1). Thus, obtained gases are an unreacted iodine pentafluoride gas, a product iodine heptafluoride gas, and an unreacted fluorine gas, and are separated and recovered as follows, by utilizing the fact that each gas is liquefied at different temperatures. Specifically, it is described that the iodine pentafluoride is cooled and collected by $IF_5$ cold trap 40, iodine heptafluoride is cooled and collected by $IF_7$ cold trap 44, and iodine heptafluoride collected in the $IF_7$ cold trap 44 is gasified by switching the cooling to heating and transferred (recovered) to $IF_7$ recovery cylinder 66 (paragraph 0020 in Patent Document 1).

RELATED DOCUMENT

Patent Document

[Patent Document 1] Japanese Unexamined Patent Publication No. 2006-265057

SUMMARY OF THE INVENTION

However, as a result of the study by the present inventor, it was found that $IF_7$ gas described in Patent Document 1 has room for improvement in terms of speed of an etching rate and variations.

As a result of further study, the present inventor found that in a case where $IF_7$ single gas is used as a substrate processing gas, the maximum etching rate becomes good, but variation in the etching rate may increase. When the etching rate of the substrate processing gas changes, there is a concern that etching conditions such as the etching rate and etching depth may be affected and variations in quality between products may occur.

Further intensive research based on such findings revealed that variations in etching rate may be suppressed by using a mixed gas in which $IF_5$ is added to $IF_7$. Although detailed mechanism is not clear, it is considered that, since $IF_5$ may suppress decomposition of $IF_7$ generated in the $IF_7$ single gas, the variation in the etching rate may be suppressed.

On the other hand, it was found that, by appropriately selecting an upper limit of the amount of $IF_5$ to be added to $IF_7$, it is possible to suppress the etching rate from being lowered to be equal to or less than a predetermined value.

As described above, it was found that, by appropriately controlling a range of the amount of $IF_5$ to be added to $IF_7$, it is possible to increase the speed of the etching rate of a substrate processing gas and is also possible to suppress variation in the etching rate. Then, the present invention was completed.

There is provided a substrate processing gas containing $IF_5$ and $IF_7$, in which a content of the $IF_5$ is equal to or more than 1 ppm and equal to or less than 2% on a volume basis with respect to a total amount of the $IF_5$ and the $IF_7$.

According to the present invention, there is also provided a storage container filled with the substrate processing gas.

According to the present invention, there is also provided a substrate processing method including dry-etching silicon without plasma, using the substrate processing gas.

According to the present invention, there are provided a substrate processing gas which is excellent in speed of an etching rate and suppression of variation in the etching rate, a storage container for storing the same, and a substrate processing method.

DESCRIPTION OF EMBODIMENTS

An outline of a substrate processing gas of the present embodiment will be described.

The substrate processing gas of the present embodiment contains $IF_5$ and $IF_7$. A content of the $IF_5$ in the substrate processing gas can be set to equal to or more than 1 ppm and equal to or less than 2% on a volume basis with respect to the total amount of the $IF_5$ and the $IF_7$.

According to findings of the present inventor, it was found in a case where $IF_7$ single gas was used as a substrate processing gas, variation in an etching rate occurred. It was considered that decomposition of $IF_7$ causes the variation in the etching rate, and as a result of proceeding with the study, it was found that the variation in the etching rate of the substrate processing gas can be suppressed by adding a trace amount of $IF_5$ to the $IF_7$. Although a detailed mechanism is not clear, it is considered that the decomposition of the $IF_7$ during storage ($IF_7 \rightarrow IF_5 + F_2$) can be suppressed by the trace amount of $IF_5$.

On the other hand, it was found that in a case where a mixed gas obtained by adding a large amount of $IF_5$ to the $IF_7$ was used, the etching rate decreased excessively. Although a detailed mechanism is not clear, it is considered that an excessive amount of $IF_5$ has a boiling point lower than that of $IF_7$, and thus is condensed first and forms an $IF_5$ layer (functioning as an etching stop layer) on a surface of a treatment surface to suppress a reaction between the $IF_7$ and the treatment surface. The reason was considered that the excessive amount of $IF_5$ interferes with an etching ability of $IF_7$, and as a result of proceeding with the study, it was found that it is possible to suppress a decrease in the speed of the etching rate of the substrate processing gas, by appropriately selecting an upper limit of the amount of $IF_5$ to be added to $IF_7$.

As described above, in the substrate processing gas containing both components of $IF_7$ and $IF_5$, by adding the $IF_5$ to the $IF_7$ in the amount of equal to or less than the upper limit value, it is possible to increase the speed of the etching rate by the $IF_7$ and by adding the $IF_5$ to the $IF_7$ in the amount of equal to or more than the lower limit value, it is possible to suppress variation in the etching rate by the $IF_7$.

The substrate processing gas of the present embodiment can be used as a cleaning gas in various fields such as a semiconductor field. The substrate processing gas can be used, for example, as a cleaning gas for etching a substrate, forming a thin film such as chemical vapor deposition (CVD), and cleaning an inside of a semiconductor producing apparatus, in a semiconductor production process for a micro electromechanical systems (MEMS) device, a liquid crystal thin film transistor (TFT) panel, a solar cell, and the like. Among these, the substrate processing gas can be preferably used as an etching gas compatible with miniaturization in the semiconductor field.

Hereinafter, components of the substrate processing gas of the present embodiment will be described in detail.

The substrate processing gas of the present embodiment contains $IF_5$ and $IF_7$.

The upper limit value of the content of the $IF_5$ in the substrate processing gas is equal to or less than 2% (% by volume) on a volume basis with respect to the sum (100 volume %) of the amount of the $IF_5$ and the $IF_7$, preferably equal to or less than 1.5%, and more preferably equal to or less than 1%. Accordingly, it is possible to suppress a decrease in the speed of the etching rate in $IF_7$. For example, in a case where dry-etching of the silicon (a silicon substrate with a polysilicon film) is performed 10 times using the substrate processing gas, an average value of the etching rates is preferably equal to or more than 100 nm/min, and more preferably equal to or more than 150 nm/min, and particularly preferably equal to or more than 200 nm/min.

The lower limit value of the content of the $IF_5$ in the substrate processing gas is, for example, equal to or more than 1 ppm, preferably equal to or more than 5 ppm, and more preferably equal to or more than 10 ppm on a volume basis with respect to the sum of the amount of the $IF_5$ and the $IF_7$ (100% by volume). Accordingly, it is possible to suppress a variation in the etching rate in $IF_7$. For example, in a case where the dry-etching of the silicon (a silicon substrate with a polysilicon film) is performed 10 times using the substrate processing gas, a standard deviation of the etching rate is preferably equal to or less than 10, and more preferably equal to or less than 5.

The lower limit value of the content of the $IF_7$ is, for example, equal to or more than 50% (% by volume), preferably equal to or more than 80%, more preferably equal to or more than 90%, and further preferably equal to or more than 95% on a volume basis with respect to the entirety of the substrate processing gas (100% by volume). Accordingly, the speed of the etching rate in the $IF_7$ increases. On the other hand, the upper limit value of the content of the $IF_7$ may be, for example, equal to or less than 99.99%, equal to or less than 99.9%, equal to or less than 99%, or equal to or less than 98%, on a volume basis with respect to the entirety of the substrate processing gas (100% by volume). Accordingly, it is possible to suppress a variation in the etching rate in the $IF_7$.

The substrate processing gas may contain other components in addition to the $IF_7$ and the $IF_5$. Examples of other components include a metal component.

Examples of the metal component (metal impurity) of the substrate processing gas include one or more metals selected from the group consisting of Fe, Cr, Mn, Co, Ti, Mo, Cu, and Ni or an oxide of the metal and a metal compound such as halides and acid halides.

The substrate processing gas contains one or more metals selected from the group consisting of Fe, Cr, Mn, Co, Ti, Mo, Cu, and Ni. A content of each of the metal contained is equal to or less than 100 ppb (ppb by mass), preferably equal to or less than 80 ppb, more preferably equal to or less than 50 ppb, and further preferably equal to or less than 30 ppb on a mass basis, with respect to the entirety of the substrate processing gas (100% by mass). Accordingly, it is possible to realize a high-purity substrate processing gas that is excellent in production stability of a product. Each lower limit value of the content of the metal is not particularly limited, and may be, for example, equal to or more than 0.1 ppb on a mass basis.

In the substrate processing gas of the present embodiment, the content of the metal component or a gas component can be measured by, for example, an inductively coupled plasma mass spectrometer (ICP-MS).

The substrate processing gas of the present embodiment may be appropriately used in combination with an oxidizing gas and/or an inert gas, in order to adjust a performance as an etching gas, unless the effects of the present invention are impaired. A content rate of the substrate processing gas in the etching gas is appropriately adjusted to fall within a range of 1% by volume to 100% by volume, for example.

Examples of the oxidizing gas include an oxygen-containing gas such as $O_2$, $O_3$, $CO_2$, $COCl_2$, $COF_2$, $N_2O$, $NO$, and $NO_2$, and a halogen gas such as $HF$, $F_2$, $NF_3$, $Cl_2$, $Br_2$, $I_2$, $YF_n$ (Y=Cl, Br, or I, and $1 \leq n \leq 5$). Among these, $O_2$, $COF_2$, $F_2$, $NF_3$, and $Cl_2$ are preferable.

The amount of the oxidizing gas added is appropriately adjusted depending on the performance and shape of the etching apparatus to be used and an etching condition.

Examples of the inert gas include $N_2$, Ar, Ne, He, and Kr.

In a case where the substrate processing gas of the present embodiment is used as an etching gas, examples thereof may include those produced and recovered by a method of producing a substrate processing gas to be described below, those stored in a storage container, those with which a storage tank in a gas supply system is filled, and those supplied in a reaction chamber in an etching apparatus.

In the present embodiment, an object to be processed by the dry-etching method is not particularly limited as long as a structure such as a semiconductor element has a material such as silicon, which reacts with $IF_7$. The substrate processing gas can be applied to the object to be processed made of silicon alone, and can also be applied to a structure such as a semiconductor element including a silicon layer and an etching resistant member that does not substantially react with $IF_7$. In addition, the substrate processing gas can be used for surface processing of a silicon substrate. Specifically, for example, the substrate processing gas can be used for forming a trench or a hole in a silicon substrate.

As the silicon layer, a silicon layer used for forming a semiconductor element is suitable, and examples thereof include an amorphous silicon film, a polysilicon film, and a single crystal silicon film.

In addition, there may be a case where the etching resistant member is used as a mask for processing a silicon layer into a predetermined shape or a case where by removing the silicon layer of an object to be processed, the etching resistant member itself is formed into a predetermined shape such as a three-dimensional structure and the etching resistant member is used as a structure of a semiconductor element.

In the case where the etching resistant member is used as the mask, a method of selectively etching a silicon layer by using a mask patterned on a surface of the silicon layer into a predetermined shape and using the substrate processing gas of the present embodiment as an etching gas without plasma may be applied. A material used for the mask is not particularly limited as long as the material does not substantially react with $IF_7$, and examples thereof include $SiO_2$, SiOC, SiON, SiN, TiN, $TiO_2$, photoresist, a carbon-based material, and a metal material such as Ru, Cu, Ni, Co, Hf, Zf, and oxides thereof.

Hereinafter, a method of producing the substrate processing gas of the present embodiment will be described in detail.

As an example of the method of producing the substrate processing gas of the present embodiment, it is possible to include a reaction step of reacting two or more compounds to obtain an $IF_7$-containing gas, and a purification step of purifying the obtained $IF_7$-containing gas to obtain an $IF_7$-purified gas. Here, the $IF_7$ purified gas refers to a gas obtained by purifying the $IF_7$.

The reaction step of obtaining the $IF_7$-containing gas is not particularly limited, and includes a step of reacting two or more compounds such as a first raw material and a second raw material to obtain the $IF_7$-containing gas. Specific examples of the method of obtaining the $IF_7$-containing gas include a first method of reacting $IF_5$ as the first raw material with $F_2$ as the second raw material to obtain an $IF_7$ gas, and a second method of reacting $F_2$ as the first raw material with $I_2$ as the second raw material to obtain the $IF_7$ gas.

In the first method, a method of obtaining the $IF_7$-containing gas by reacting the $IF_5$ gas with the $F_2$ gas after the $IF_5$ gas is obtained by reacting the $IF_7$ gas with $I_2$ (solid) dispersed in the $IF_5$ (liquid) may be adopted. Accordingly, it is possible to large-scale synthesis with a small facility. In addition, in the second method, a method of obtaining the $IF_7$-containing gas by gas-gas synthesis in which the $F_2$ gas and the $I_2$ gas are directly reacted may be adopted. In both the first method and the second method, a fluorinating agent such as an $NF_3$ gas or a $ClF_3$ gas can be used instead of the $F_2$ gas.

In the step of purifying the $IF_7$-containing gas, various known purification means can be used, for example, distillation means can be used. Accordingly, the $IF_7$ can be separated and recovered from the $IF_7$-containing gas by utilizing difference in boiling points.

Here, in a case where a fluorinated interhalogen compound or a halogen molecule raw material having high oxidizing property or corrosive property contacts a metal material during the (synthesis) reaction step, storage, or transportation of the $IF_7$-containing gas, it is presumed that impurities (components other than the $IF_7$) are mixed in the obtained $IF_7$-containing gas. Examples of the metal material include members that configure an inside of a container, a valve, a pipe, and the like that make up appliances or equipment.

A content of the impurities in the $IF_7$-containing gas can be appropriately adjusted by a purification step such as distillation.

As the distillation means, for example, a distillation process including one or more selected from the group consisting of batch distillation, continuous distillation, atmospheric distillation, reduced-pressure distillation (vacuum distillation), simple distillation, and precision distillation can be carried out. These may be used alone or two or more thereof may be used in combination. In addition, these may be carried out repeatedly. In addition, by using a distillation column and controlling a distillation condition appropriately, the separability between the $IF_7$ and the components other than the $IF_7$ in the $IF_7$-containing gas can be improved.

In the present embodiment, for example, by appropriately selecting the $IF_7$ reaction step or the $IF_7$ purification step, in the substrate processing gas, it is possible to control a content of the $IF_7$, a content of the $IF_5$, and the content of other components. Among these, for example, appropriate selection of the distillation condition or the distillation procedure, mixing the purified $IF_7$ with the purified $IF_5$, and the like are exemplified as factors for controlling the content of $IF_7$, the content of the $IF_5$, and the content of other components in the substrate processing gas to be in a desired numerical range.

In addition, in the reaction in which a fluorine-containing component is reacted with an iodine-containing component to obtain the $IF_7$, by setting F/I to be equal to or more than 6.86 and less than 7, the $IF_7$ containing a trace amount of $IF_5$ can be obtained and the substrate processing gas of the present embodiment can be obtained.

The storage container of the present embodiment is filled with the substrate processing gas. The $IF_7$ and the $IF_5$ (gas component) can be stored as liquid in the storage container. Accordingly, storability and transportability can be improved.

The storage container may include a metal container having an internal space, an inlet or outlet port of a gas component, which is provided in the metal container, and a valve provided at the inlet or outlet port. The gas component introduced from the inlet or outlet port is stored in an internal space inside the metal container. Accordingly, it is possible to improve handleability of the gas components.

It is preferable that, in the metal container of the storage container, at least an inside (an inner wall contacting with the $IF_7$) is made of corrosion-resistant metal or ceramics. Examples of the corrosion-resistant metal or ceramics include nickel, nickel-based alloys, stainless steel (SUS), manganese steel, aluminum, aluminum-based alloys, titanium, titanium-based alloys, platinum, and alumina. Among these, the metal container is more preferably made of nickel, such as nickel or nickel-based alloy, or SUS, from the viewpoint of being inexpensive and easy to handle. In a case where the SUS is used, it is preferable to perform a process such as flowing a fluorine compound gas or a fluorine gas to form a passivation film on a surface, before filling with the $IF_7$. Accordingly, it is possible to store and transport the $IF_7$ while maintaining high purity.

EXAMPLES

Hereinafter, the present invention will be described in detail with reference to examples, but the present invention is not limited to the description of these examples.

Preparation of Substrate Processing Gas

Examples 1 to 4 and Comparative Examples 1 and 2

$IF_7$ was distilled to obtain high-purity $IF_7$ (purity of equal to or higher than 99.9%, $IF_5$ concentration of equal to or lower than 0.5 ppm by volume). In addition, $IF_5$ was distilled to obtain high-purity $IF_5$ (purity of equal to or higher than 99.9%, $IF_7$ concentration of equal to or lower than 0.5 ppm by volume).

As a substrate processing gas in Comparative Example 1, the obtained high-purity $IF_7$ was used as it was.

As a substrate processing gas of Examples 1 to 4 and Comparative Example 2, a mixed gas in which the high-purity $IF_5$ is mixed with the obtained high-purity $IF_7$ was obtained under conditions of $IF_5$ concentration shown in Table 1, and the obtained mixed gas was used. In Table 1, the $IF_5$ concentration (content of $IF_5$) is expressed on a volume basis, with respect to a total amount of $IF_5$ and $IF_7$.

The content of each metal component contained in the substrate processing gas of Examples 1 to 4 was measured by an inductively coupled plasma mass spectrometer (ICP-MS). As a result, the content of each metal component of Fe, Cr, Mn, Co, Ti, Mo, Cu, and Ni was equal to or less than 100 ppb by mass.

(Evaluation of Etching Rate)

First, a configuration of an etching apparatus will be described. A reaction chamber is equipped with a stage for supporting a sample. As the sample, a 6-inch silicon substrate on which a silicon oxide film (20 nm) was formed and a polysilicon film (30 μm) was further formed thereon was used. The stage is equipped with a stage temperature adjuster capable of adjusting a temperature of the stage. A first gas pipe for introducing a gas and a second gas pipe for exhausting a gas are connected to the reaction chamber. An etching gas supply system is connected to the first gas pipe through a first valve and supplies the substrate processing gas to the reaction chamber. A vacuum pump is connected to the second gas pipe through a second valve for exhausting gas.

A pressure inside the reaction chamber is controlled by the second valve based on an indicated value of a pressure gauge attached to the reaction chamber.

Next, a method of operating the etching apparatus will be described. The sample is placed on the stage, the inside of the reaction chamber, the inside of the first gas pipe, and the inside of the second gas pipe are vacuum replaced to 1.5 kPa, and then the temperature of the stage is set to a predetermined value (25° C.). After confirming that the temperature of the stage has reached the predetermined value, the first valve and the second valve are opened, the pressure of the etching gas supply system is set to a predetermined pressure (100 Pa). Then, each substrate processing gas of Examples 1-4 and Comparative Examples 1 and 2 is introduced into the reaction chamber by the first gas pipe. A total flow rate of the substrate processing gas at this time was set to 100 sccm. No plasma was generated when the substrate processing gas was introduced into the reaction chamber.

After a predetermined time (processing time for etching, 1 minute) has passed after introducing the substrate processing gas, the introduction of the substrate processing gas was stopped, the inside of the reaction chamber was vacuum replaced, and then the sample was taken out to measure the etching rate.

Using the silicon substrate with a polysilicon film (sample), a film thickness of the polysilicon film before etching and a film thickness of the polysilicon film after etching were measured at five points respectively, and the etching amount at each measurement point (a difference in film thickness before and after the etching) was determined. An etching rate (nm/min) was calculated from an average etching amount at each measurement point and the etching time.

Using the substrate processing gas of Examples 1 to 4 and Comparative Examples 1 and 2 as the etching gas, the etching rates were evaluated 10 times using different silicon substrates, and the average value and a standard deviation thereof were determined. Table 1 shows evaluation results.

TABLE 1

| | $IF_5$ concentration | Pressure | Temperature | Processing time | Etching rate [nm/min] | | | |
| --- | --- | --- | --- | --- | --- | --- | --- | --- |
| | | | | | First time | Second time | Third time | Fourth time |
| Example 1 | 1 ppm | 100 Pa | 25° C. | 1 min. | 261 | 265 | 262 | 267 |
| Example 2 | 10 ppm | 100 Pa | 25° C. | 1 min. | 234 | 237 | 232 | 238 |
| Example 3 | 800 ppm | 100 Pa | 25° C. | 1 min. | 221 | 219 | 220 | 215 |
| Example 4 | 1% | 100 Pa | 25° C. | 1 min. | 202 | 199 | 204 | 200 |
| Comparative Example 1 | <0.5 ppm | 100 Pa | 25° C. | 1 min. | 258 | 298 | 167 | 287 |
| Comparative Example 2 | 3% | 100 Pa | 25° C. | 1 min. | 22 | 21 | 30 | 40 |

| | Etching rate [nm/min] | | | | | | | |
| --- | --- | --- | --- | --- | --- | --- | --- | --- |
| | Fifth time | Sixth time | Seventh time | Eighth time | Ninth time | Tenth time | Average | Standard deviation |
| Example 1 | 260 | 265 | 266 | 255 | 263 | 262 | 262.6 | 3.5 |
| Example 2 | 234 | 230 | 231 | 237 | 236 | 235 | 234.4 | 2.7 |
| Example 3 | 215 | 221 | 221 | 216 | 217 | 214 | 217.9 | 2.8 |
| Example 4 | 207 | 202 | 207 | 197 | 201 | 203 | 202.2 | 3.2 |
| Comparative Example 1 | 224 | 233 | 202 | 273 | 271 | 217 | 243.0 | 41.5 |
| Comparative Example 2 | 43 | 24 | 20 | 17 | 35 | 33 | 28.5 | 9.0 |

It was found that, as the etching gas, the substrate processing gases of Examples 1 to 4 have suppressed variation in the etching rate compared to Comparative Example 1, and were excellent in speed of etching rate, compared to Comparative Example 2.

Priority is claimed on Japanese Patent Application No. 2018-065433, filed Mar. 29, 2018, the entire disclosure of which is incorporated herein.

The invention claimed is:

1. A substrate processing gas comprising:
   $IF_5$; and
   $IF_7$,
   wherein a content of the $IF_5$ is greater than or equal to 1 ppm on a volume basis and less than or equal to 1% on a volume basis with respect to a total amount of the $IF_5$ and the $IF_7$.

2. The substrate processing gas according to claim 1, wherein a content of the $IF_7$ is greater than or equal to 50% on a volume basis with respect to a total amount of the substrate processing gas.

3. The substrate processing gas according to claim 1, wherein the content of the $IF_5$ is greater than or equal to 10 ppm on a volume basis and less than or equal to 1% on a volume basis with respect to the total amount of the $IF_5$ and the $IF_7$.

4. The substrate processing gas according to claim 1,
wherein the content of the $IF_5$ is greater than or equal to 5 ppm on a volume basis and less than or equal to 1% on a volume basis with respect to the total amount of the $IF_5$ and the $IF_7$.

5. The substrate processing gas according to claim 1,
wherein a content of the $IF_7$ is less than or equal to 99.99% on a volume basis with respect to a total amount of the substrate processing gas.

6. The substrate processing gas according to claim 1,
wherein a content of the $IF_7$ is less than or equal to 98% on a volume basis with respect to a total amount of the substrate processing gas.

7. The substrate processing gas according to claim 1, further comprising:
at least one metal selected from the group consisting of Fe, Cr, Mn, Co, Ti, Mo, Cu, and Ni,
wherein a content of each of the metals contained is less than or equal to 100 ppb on a mass basis, with respect to a total amount of the substrate processing gas.

8. The substrate processing gas according to claim 7,
wherein the content of each of the metals contained is greater than or equal to 0.1 ppb on a mass basis, with respect to a total amount of the substrate processing gas.

9. The substrate processing gas according to claim 1,
wherein the substrate processing gas is an etching gas.

10. The substrate processing gas according to claim 9,
further comprising an oxidizing gas and/or an inert gas.

11. The substrate processing gas according to claim 10,
wherein the oxidizing gas comprises at least one gas selected from the group consisting of $O_2$, $O_3$, $CO_2$, $COCl_2$, $COF_2$, $N_2O$, NO, $NO_2$, HF, $F_2$, $NF_3$, $Cl_2$, $Br_2$, $I_2$, and $YF_n$ (Y=Cl, Br, or I, and $1 \leq n \leq 5$).

12. The substrate processing gas according to claim 10,
wherein the inert gas comprises at least one gas selected from the group consisting of $N_2$, Ar, Ne, He, and Kr.

13. A storage container filled with the substrate processing gas according to claim 1.

14. The storage container according to claim 13, wherein the storage container is a metal container.

15. A substrate processing method comprising: dry-etching silicon without plasma, using the substrate processing gas according to claim 1.

16. The substrate processing method according to claim 15,
wherein in a case where the dry-etching of the silicon is performed 10 times,
an average value of etching rates is greater than or equal to 100 nm/min, and
a standard deviation of the etching rates is less than or equal to 10.

17. The substrate processing method according to claim 15,
wherein in a case where the dry-etching of the silicon is performed 10 times,
an average value of etching rates is greater than or equal to 200 nm/min, and
a standard deviation of the etching rates is less than or equal to 5.

* * * * *